(12) United States Patent
Rivoirard et al.

(10) Patent No.: US 11,757,477 B2
(45) Date of Patent: Sep. 12, 2023

(54) DEVICE FOR GENERATING RADIOFREQUENCY SIGNALS IN PHASE QUADRATURE

(71) Applicant: STMicroelectronics (Alps) SAS, Grenoble (FR)

(72) Inventors: Frederic Rivoirard, Fontaine (FR); Felix Gauthier, Grenoble (FR)

(73) Assignee: STMICROELECTRONICS (ALPS) SAS, Grenoble (FR)

( * ) Notice: Subject to any disclaimer, the term of this patent is extended or adjusted under 35 U.S.C. 154(b) by 52 days.

(21) Appl. No.: 17/187,024

(22) Filed: Feb. 26, 2021

(65) Prior Publication Data

US 2021/0273664 A1    Sep. 2, 2021

(30) Foreign Application Priority Data

Feb. 27, 2020 (FR) ...................... 2001936

(51) Int. Cl.
  *H04B 1/00* (2006.01)
  *H03D 7/12* (2006.01)
  *H04W 88/06* (2009.01)

(52) U.S. Cl.
  CPC ........... *H04B 1/0096* (2013.01); *H03D 7/125* (2013.01); *H04W 88/06* (2013.01)

(58) Field of Classification Search
  CPC ........ H04B 1/0096; H04B 1/408; H04B 1/40; H03D 7/125; H03D 7/1441; H03D 7/1458; H03D 2200/0019; H04W 88/06; H03B 19/14; H03B 27/00; H03B 5/20–28; H03B 28/00
  See application file for complete search history.

(56) References Cited

U.S. PATENT DOCUMENTS

| | | | | |
|---|---|---|---|---|
| 4,912,430 A | * | 3/1990 | Frank ..................... | H03F 1/306 |
| | | | | 330/296 |
| 5,963,094 A | * | 10/1999 | Linder .................. | H03F 3/3001 |
| | | | | 330/264 |
| 6,404,293 B1 | * | 6/2002 | Darabi ................... | H03B 21/01 |
| | | | | 331/37 |

(Continued)

FOREIGN PATENT DOCUMENTS

EP    1343248 A2    3/2003

OTHER PUBLICATIONS

Farid, T. et al., "A High-Performance Doubly Balanced Mixer In 0.35 um CMOS for MODE-1 MB-OFDM UWB Receivers" Wireless Personal Communications, Kluwer Academic Publishers DO, vol. 46, No. 3, Dec. 21, 2007, pp. 351-363.

(Continued)

*Primary Examiner* — Jinsong Hu
*Assistant Examiner* — Rui M Hu
(74) *Attorney, Agent, or Firm* — Slater Matsil, LLP

(57) ABSTRACT

An embodiment integrated electronic device comprises a mixer module including a voltage/current transconductor stage including first transistors and connected to a mixing stage including second transistors, wherein the mixing stage includes a resistive degeneration circuit connected to the sources of the second transistors and a calibration input connected to the gates of the second transistors and intended to receive an adjustable calibration voltage, and the sources of the first transistors are directly connected to a cold power supply point.

19 Claims, 5 Drawing Sheets

(56) References Cited

U.S. PATENT DOCUMENTS

| | | | |
|---|---|---|---|
| 6,564,045 B1* | 5/2003 | Fransis | H03D 7/165 455/190.1 |
| 6,687,494 B1* | 2/2004 | Mourant | H04B 1/28 455/302 |
| 6,871,057 B2* | 3/2005 | Ugajin | H03D 7/165 455/313 |
| 7,177,620 B1* | 2/2007 | Tsai | H03D 7/1441 455/333 |
| 7,302,011 B1* | 11/2007 | Granger-Jones | H03B 19/14 381/15 |
| 8,676,145 B2* | 3/2014 | Kaczman | H04B 1/30 455/313 |
| 8,897,727 B2* | 11/2014 | Wang | G01R 29/0871 455/226.1 |
| 9,680,454 B2* | 6/2017 | Chueh | H03K 5/00006 |
| 10,291,183 B1* | 5/2019 | Syed | H04B 1/04 |
| 10,855,225 B1* | 12/2020 | Taghivand | H04B 1/0057 |
| 10,979,038 B2* | 4/2021 | Frounchi | H03K 5/13 |
| 2001/0021645 A1* | 9/2001 | Ugajin | H03D 7/165 455/333 |
| 2003/0017816 A1* | 1/2003 | Souetinov | H03D 7/1441 455/323 |
| 2003/0117200 A1* | 6/2003 | Koh | H03B 5/1209 327/238 |
| 2004/0048591 A1* | 3/2004 | Kim | H04B 1/005 455/168.1 |
| 2004/0147240 A1 | 7/2004 | Igarashi et al. | |
| 2004/0166799 A1* | 8/2004 | Kral | H03D 7/165 455/319 |
| 2005/0107063 A1* | 5/2005 | Grewing | H03B 27/00 455/323 |
| 2005/0215223 A1* | 9/2005 | Lin | H03D 7/1441 455/317 |
| 2006/0246861 A1* | 11/2006 | Dosanjh | H03D 3/007 455/147 |
| 2007/0173218 A1* | 7/2007 | Oh | H03B 5/1228 455/260 |
| 2008/0030244 A1* | 2/2008 | Leifso | H03B 19/14 327/122 |
| 2008/0032646 A1* | 2/2008 | Huang | H03D 7/1483 455/131 |
| 2008/0068052 A1 | 3/2008 | Tsai et al. | |
| 2008/0169877 A1* | 7/2008 | Banba | H03H 7/38 330/306 |
| 2008/0248776 A1* | 10/2008 | Banba | H03D 7/1458 455/327 |
| 2009/0111420 A1* | 4/2009 | Tasic | H04B 1/30 455/334 |
| 2009/0154595 A1* | 6/2009 | Choksi | H04L 5/1461 375/295 |
| 2009/0219094 A1* | 9/2009 | Kim | H03D 7/1491 330/253 |
| 2010/0029234 A1* | 2/2010 | Joos | H03D 7/1458 455/209 |
| 2010/0035571 A1* | 2/2010 | Zhang | H03D 7/1483 455/323 |
| 2010/0144290 A1* | 6/2010 | Khatri | H03D 7/1433 455/84 |
| 2010/0164595 A1* | 7/2010 | Radice | H03D 7/1441 327/356 |
| 2010/0201449 A1* | 8/2010 | Hasegawa | H03F 1/342 330/296 |
| 2010/0219875 A1* | 9/2010 | Chou | G06G 7/16 327/359 |
| 2010/0225375 A1* | 9/2010 | Ikebe | H03B 27/00 327/361 |
| 2011/0003571 A1* | 1/2011 | Park | H03B 27/00 331/47 |
| 2012/0120992 A1* | 5/2012 | Soltanian | H03L 7/099 375/219 |
| 2012/0155580 A1* | 6/2012 | Wang | H04L 27/3863 375/344 |
| 2012/0229216 A1* | 9/2012 | Benson | H03F 1/42 330/291 |
| 2012/0321020 A1* | 12/2012 | Eldesouki | H03D 7/1441 375/318 |
| 2012/0326763 A1* | 12/2012 | Dawson | H03D 7/1458 327/359 |
| 2013/0344834 A1* | 12/2013 | Souto Diez | H03D 7/1441 455/245.1 |
| 2014/0155014 A1* | 6/2014 | Leung | H03D 7/1491 455/318 |
| 2014/0162580 A1* | 6/2014 | Leung | H04B 1/30 455/226.1 |
| 2014/0266390 A1* | 9/2014 | Wang | H03D 7/1491 327/355 |
| 2015/0110161 A1* | 4/2015 | Anderson | H03D 7/18 375/219 |
| 2019/0103839 A1* | 4/2019 | Lee | H03F 3/195 |
| 2019/0158075 A1* | 5/2019 | Lee | H03B 19/14 |
| 2019/0207572 A1* | 7/2019 | Lin | H03F 3/45183 |
| 2020/0028534 A1* | 1/2020 | Sivonen | H03D 7/165 |
| 2020/0119693 A1* | 4/2020 | Ezz | H03D 7/1441 |
| 2020/0356133 A1* | 11/2020 | Khalili | H03D 7/168 |

OTHER PUBLICATIONS

Leifso, C.,"A Monolithic 6GHZ Quadrature Frequency Doubler With Adjustable Phase Offset," IEEE Journal of Solid State Circuits, vol. 41, No. 2, Feb. 2006, pp. 405-412.

Puyal, V., et al., "DC-100 GHz Frequency Doublers In InP DHBT Technology," IEEE Transactions on Microwave Theory and Techniques Plenum USA, vol. 53, No. 4, Apr. 1, 2005, pp. 1338-1344.

Wang, J., "Low Power Up-Conversion Mixer With Gain Control Function," AEU—International Journal of Electronics and Communications, Elsevier Amsterdam, vol. 70, No. 8, May 6, 2006, pp. 1071-1075.

* cited by examiner

[Fig 1]
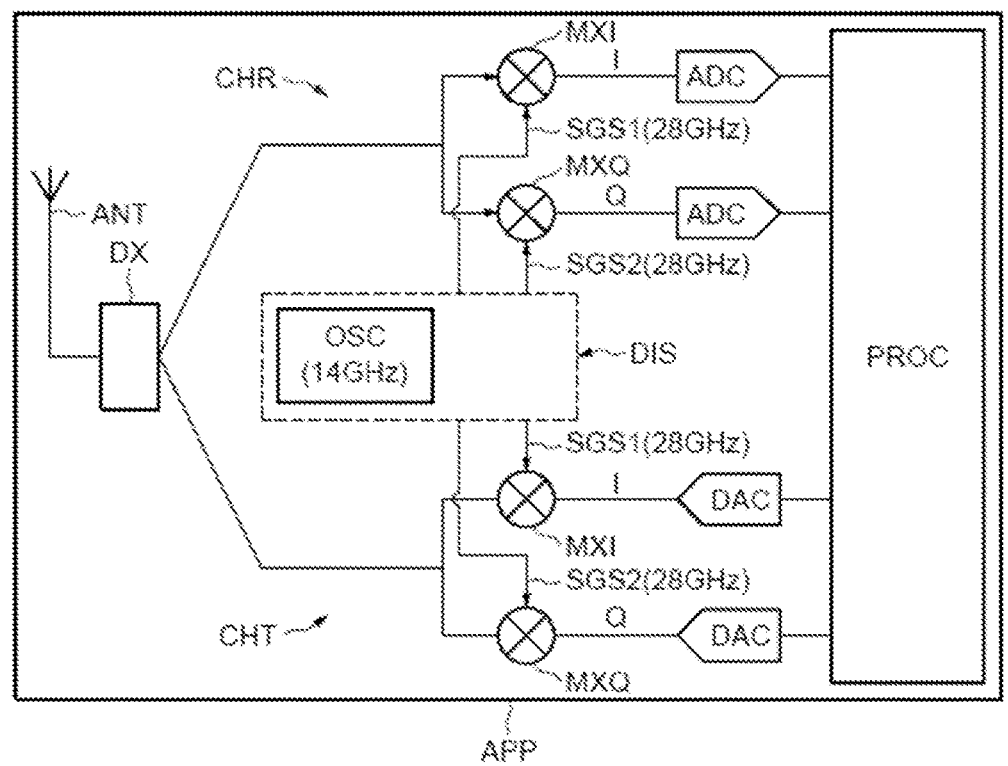

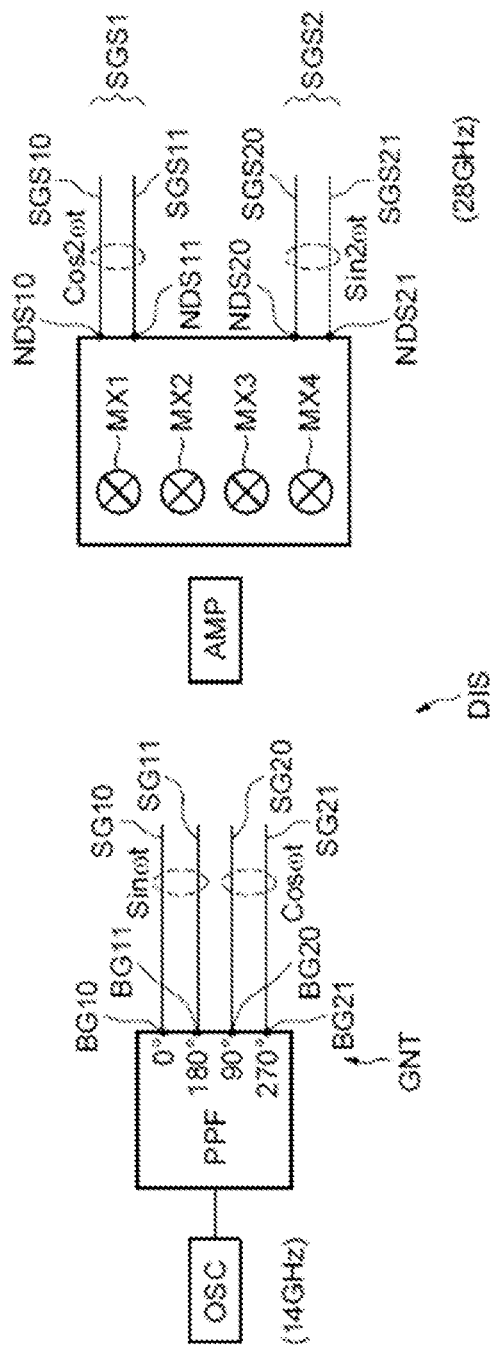

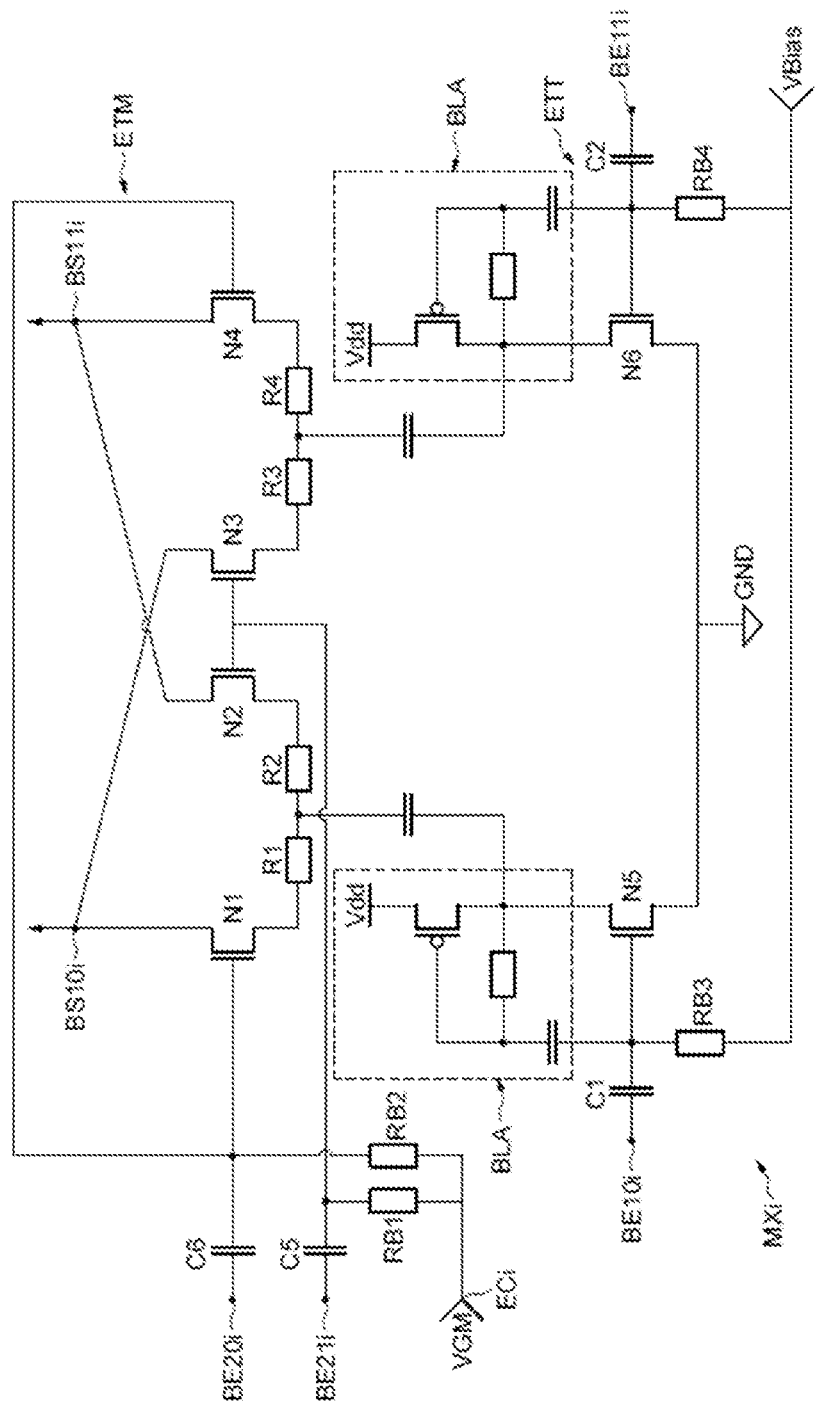
[Fig 3]

[Fig 4]
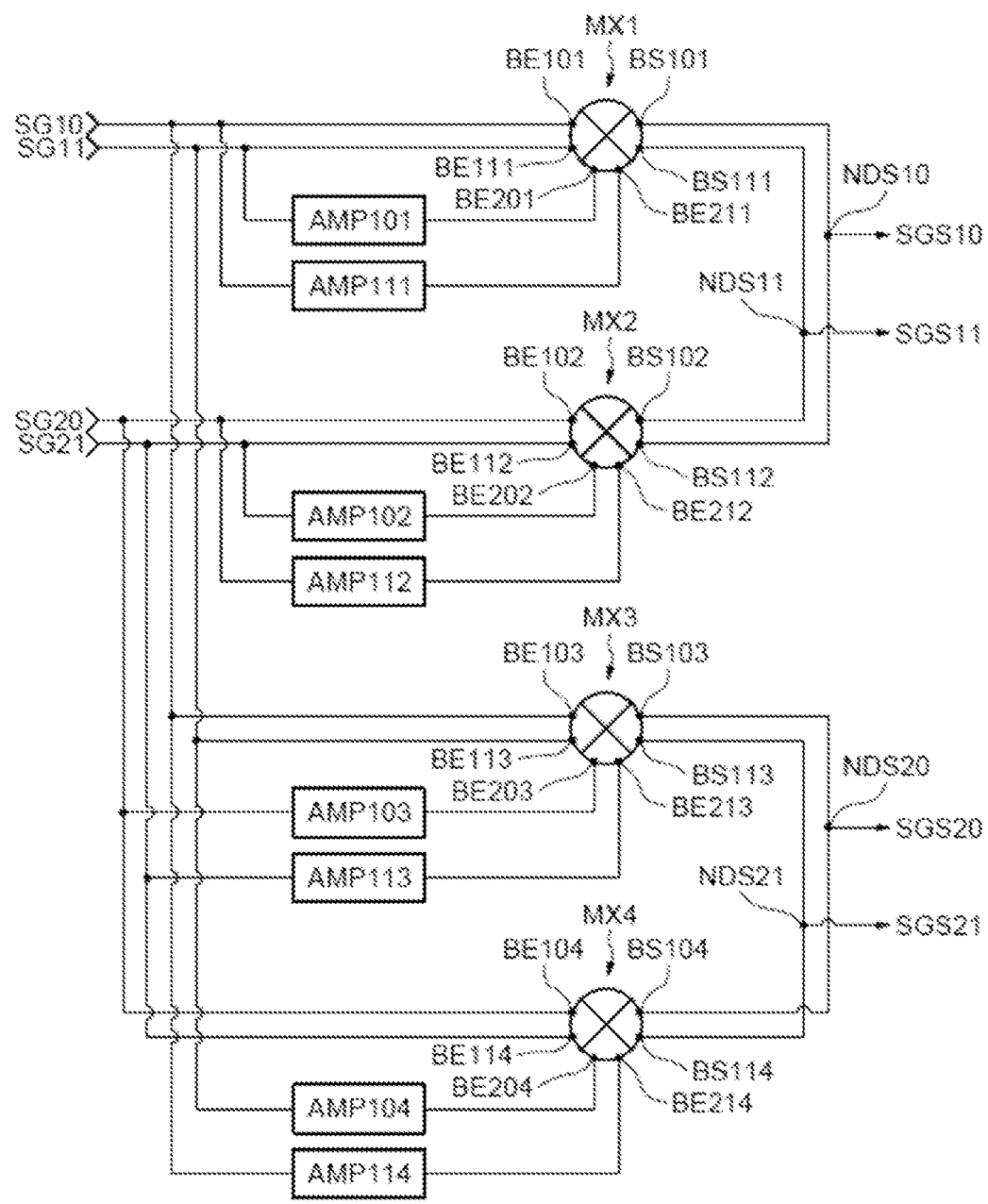

[Fig 5]
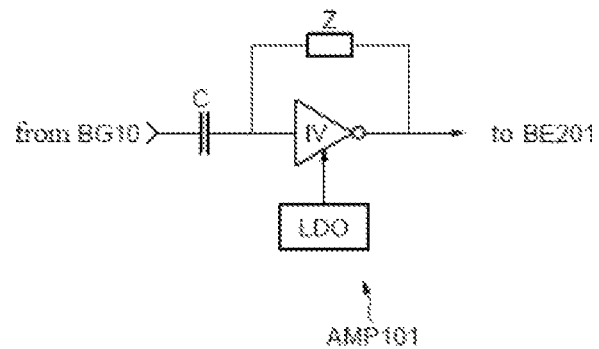
[Fig 6]
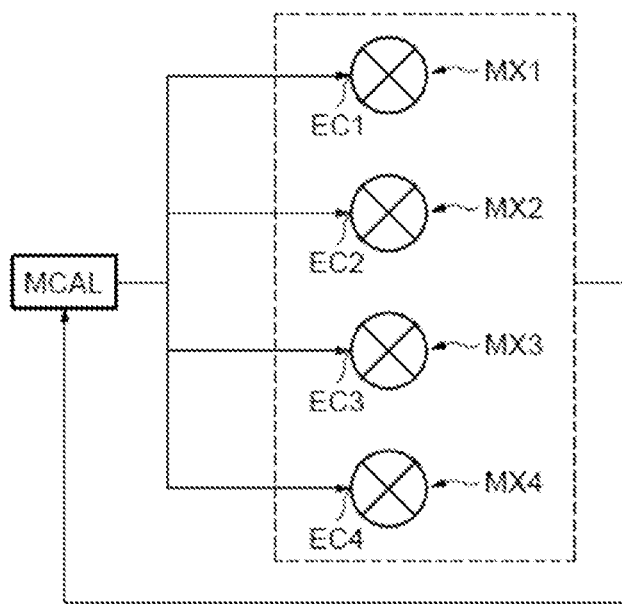

DEVICE FOR GENERATING RADIOFREQUENCY SIGNALS IN PHASE QUADRATURE

CROSS-REFERENCE TO RELATED APPLICATIONS

This application claims the benefit of French Application No. 2001936, filed on Feb. 27, 2020, which application is hereby incorporated herein by reference.

TECHNICAL FIELD

Embodiments and implementations of the invention relate to the generation of high-frequency signals, for example but not exclusively greater than 20 GHz, and in particular the generation of such signals used as frequency transposition signals (or local oscillator signals) offset by 90°, intended to allow the carrying out of a downward or upward frequency transposition on received radio-frequency signals (downward transposition) or on baseband signals (upward transposition) intended to be emitted.

BACKGROUND

In telecommunications such as fifth generation "5G" telecommunications, it is required to be able to generate transposition signals or signals of local oscillators offset by 90°, at a frequency equal for example to 28 GHz, without this value being limiting.

A known solution involves using a voltage-controlled oscillator generating a sinusoidal signal having a frequency of 56 GHz then a frequency divider to obtain the transposition signal at 28 GHz.

However, the propagation of a signal at 56 GHz in a circuit and the use of a frequency divider is a costly solution in terms of consumption.

In the article by Curtis Leifso et al., entitled "A Monolithic 6 GHz Quadrature Frequency Doubler With Adjustable Phase Offset", IEEE Journal of Solid-state circuits, vol. 41, N° 2, February 2006, a frequency doubler at 6 GHz was proposed allowing, using a polyphase filter and a combination of mixers associated with an adder and a subtractor, to deliver at the output two signals offset by 90° having a frequency double the frequency of the input oscillator signal.

However, such a structure not only takes up a significant surface area but also functions at a high power supply voltage (3.3 volts). Moreover, the Gilbert cell used in each mixer consumes DC current, which limits the performance of the structure in terms of noise.

SUMMARY

There is therefore a need to generate signals offset by 90° at a high frequency, typically greater than 20 GHz, for example 28 GHz, with an acceptable imbalance in phase and in amplitude and which offers low consumption as well as good precision of the offset by 90° of the two signals generated.

Embodiments of the invention have a particularly advantageous but non-limiting use in the field of telecommunications, and in particular in 5G telephony standards technology.

According to one embodiment, a mixer module is used including a mixing stage with emitter degeneration and an adjustment of the gate voltage of the transistors of the mixing stage, as well as a combination of such mixer modules to create a frequency doubler.

Thus, according to one aspect, an electronic device, for example integrated, comprising a mixer module is proposed.

This mixer module includes a voltage/current transconductor stage including first transistors, for example MOS transistors, and connected to a mixing stage including second transistors, for example MOS transistors.

According to this aspect, the mixing stage includes a resistive degeneration circuit connected to the sources of the second transistors and a calibration input connected to the gates of the second transistors and intended to receive an adjustable calibration voltage.

Moreover, the sources of the first transistors are directly connected to a cold power supply point, for example the ground.

Thus, according to this aspect, a degenerated passive mixing stage is used. The resistive degeneration circuit allows to correct the static error in offset by 90° and is placed at the mixing stage contrary to the frequency doubler of the prior art which has this degeneration circuit at the transistors of the voltage/current transconductor stage.

Moreover, the adjustment of the calibration voltage that controls the voltage at the gates of the transistors of the mixing stage, via digital calibration for example, allows to correct the influence of the process variations on the phase shift of the output signals of the mixer module, and when a combination of such mixer modules is used, in order to form a frequency doubler, to obtain consequently with good precision the 90 degrees of mutual phase shift between the two output signals delivered by the frequency doubler.

According to one embodiment, the transconductor stage comprises a current amplifier block connected between the gates and the drains of the first transistors.

Such a current amplifier block, although not indispensable, allows an improvement of the current gain.

According to one embodiment, the transconductor stage comprises a first input interface comprising two first input terminals respectively connected to the gates of two first transistors.

Moreover, the mixing stage comprises a second input interface including two second input terminals respectively connected to the gates of two pairs of second transistors as well as an output interface including two output terminals.

Each output terminal is connected to two second transistors belonging to two different pairs.

According to one embodiment, the two first input terminals are intended to respectively receive two first signals having a sinusoidal shape offset by 180°.

The two second input terminals are also intended to respectively receive two second signals having a sinusoidal shape offset by 180°.

The two second signals are either identical to the two first signals or offset by 90° with respect to these two first signals.

The expression "signal having a sinusoidal shape" covers both a sinusoidal signals and a cosinusoidal signal.

According to one embodiment, leading to the formation of a frequency doubler, the device comprises —a signal generator having two first terminals, called generation terminals, configured to generate two sinusoidal signals offset by 180° and two second generation terminals configured to generate two cosinusoidal signals offset by 180°, the sinusoidal and cosinusoidal signals having the same initial frequency, a first mixer module, the two first input terminals and the two second input terminals of which are respectively connected to the two first generation terminals, a second mixer module, the two first input terminals and the two second input terminals of which are respectively connected to the two second generation terminals, the two output terminals of the first mixer module being respectively connected to the two opposite output terminals of the second mixer module, in such a way as to form two first output nodes intended to generate two cosinusoidal signals offset by 180° having a frequency double the initial frequency, a third mixer module, the two first input terminals of which are respectively connected to the two first generation terminals and the two second input terminals of which are respectively connected to the two second generation terminals, a fourth mixer module, the two first input terminals of which are respectively connected to the two second generation terminals and the two second input terminals of which are respectively connected to the two first generation terminals, the two output terminals of the third mixer module being respectively connected to the two homologous output terminals of the fourth mixer module, in such a way as to form two second output nodes intended to generate two sinusoidal signals offset by 180° having a frequency double the initial frequency.

Thus, in such a structure, an adder and a subtractor are eliminated by a suitable connection of the output terminals of the various mixer modules which allow work in radio-frequency current at the output.

According to one embodiment, the signal generator includes a source, for example a voltage-controlled oscillator configured to generate an initial signal having a sinusoidal shape having said initial frequency, and a polyphase filter connected between the output of the source and the first and second generation terminals.

Moreover, the device further advantageously comprises a voltage-amplification circuit connected between each second terminal of each mixer module and the corresponding generation terminal.

This allows amplification of the signal delivered to the transistor of the mixing stage without distorting the sinusoidal signal too much.

According to one embodiment, the device further advantageously comprises a calibration circuit configured to adjust the calibration voltage according to the phase shift between the sinusoidal and cosinusoidal signals delivered at the first and second output nodes.

This calibration, for example digital, thus allows to obtain the offset by 90° between the signals delivered at the output of the frequency doubler with a very good precision, for example give or take 1 degree according to the process variations.

The initial frequency is advantageously greater than or equal to 10 GHz, for example equal to 14 GHz which allows to obtain at the output of the frequency doubler transposition signals offset by 90° having a frequency of 28 GHz.

According to another aspect, a communication apparatus is proposed, for example a cellular mobile telephone, including a reception chain and an emission chain as well as a device as defined above intended to deliver to the first and second output nodes the sinusoidal and cosinusoidal signals forming two components offset by 90° of a frequency transposition signal intended for the reception chain and for the emission chain.

The communication apparatus is thus configured to operate for example in the band of frequencies dedicated to 5G uses, with a transposition signal of 28 GHz.

BRIEF DESCRIPTION OF THE DRAWINGS

For Other advantages and features of the invention will appear upon examination of the detailed description of embodiments and implementations, in no way limiting, and of the appended drawings in which:

FIG. 1 illustrates a communication apparatus capable of receiving and emitting radio-frequency signals compatible with, e.g., 5G technology;

FIG. 2 illustrates an embodiment of a device delivering the transposition signals offset by 90°

FIG. 3 illustrates the structure of a mixer module;

FIG. 4 illustrates mutual connections of a plurality of mixing modules;

FIG. 5 illustrates an embodiment of a voltage-amplification circuit, and

FIG. 6 illustrates a calibration module connected to control inputs of four mixer modules.

DETAILED DESCRIPTION OF ILLUSTRATIVE EMBODIMENTS

In FIG. 1, the reference APP designates a communication apparatus, for example a cellular mobile telephone, capable of receiving and of emitting via an antenna ANT radio-frequency signals compatible for example with 5G technology and having in particular in the example described here a frequency of 28 GHz.

The apparatus APP includes a duplexer DX connected to the antenna as well as a reception chain CHR and an emission chain CHT connected between the duplexer DX and a processor PROC intended to carry out the baseband processing.

The reception chain includes in a manner that is conventional and known per se a mixer MXI receiving an input signal as well as a transposition signal SGS1 coming from a device DIS, for example created in an integrated circuit.

The frequency of the transposition signal SGS1 is equal to 28 GHz.

The mixer MXI thus delivers a signal in the baseband on the channel I.

The reception chain CHR further includes another mixer MXQ receiving a transposition signal SGS2 having the same frequency as the signal SGS1 but phase shifted by 90 degrees with respect to the signal SGS1 so that the mixer MXQ delivers on the channel Q a signal also in the baseband but offset by 90° with respect to the signal delivered on the channel I.

The transposition signals SGS1 and SGS2, offset by 90°, are generated by the device, the structure of which will be described in detail in reference to the following drawings, and including for example a source OSC configured to deliver an initial signal at 14 GHz.

The emission channel CHT also includes two mixers MXI and MXQ intended to receive on the one hand the emission signals in the baseband coming from the channel I and from the channel Q as well as the transposition signals SGS1 and SGS2 in such a way as to carry out an upward transposition from the baseband to the frequency of 28 GHz.

The reception chain CHR also includes two analog-to-digital converters ADC intended to convert the analog signals in the baseband of the channels I and Q into digital signals intended for the processor PROC.

As for the transmission chain, it comprises two digital-to-analog converters DAC intended to carry out a digital-to-analog conversion to deliver to the mixers MXI and MXQ the analog signals on the channel I and on the channel Q.

Reference is now made more particularly to FIG. 2 to describe an embodiment of the device delivering the transposition signals offset by 90°.

In this embodiment, the architecture is a differential architecture.

Thus, the transposition signal SGS1 illustrated in FIG. 1 actually includes two components offset by 180° SGS10 and SGS11 while the transposition signal SGS2, offset by 90° with respect to the transposition signal SGS1, includes two components offset by 180° SGS20 and SGS21.

The device DIS comprises a signal generator GNT including here the source OSC, for example a voltage-controlled oscillator or a phase-locked loop, delivering the initial signal having a sinusoidal shape having an initial frequency, here a frequency of 14 GHz.

The signal generator GNT also include a polyphase filter PPF, having a conventional structure known per se, receiving the initial signal and including two first generation terminals BG10 and BG11 as well as two second generation terminals BG20 and BG21.

The two first generation terminals BG10 and BG11 deliver two sinusoidal signals offset by 180° SG10 and SG11 having the initial frequency of 14 GHz.

The two second generation terminals BG20 and BG21 deliver two cosinusoidal signals SG20 and SG21 also having the same initial frequency of 14 GHz.

The device DIS also includes a combination of four mixer modules MX1-MX4, the output terminals of which are connected in a suitable manner as will be seen in more detail below, in such a way as to form two first output nodes NDS10 and NDS11 and two second output nodes NDS20 and NDS21.

The two first output nodes NDS10 and NDS11 respectively deliver the two signals SGS10 and SGS11 (the two components of the transposition signal SGS1) offset by 180°, which are actually two cosinusoidal signals offset by 180°, having a frequency double the initial frequency, or the frequency of 28 GHz.

The two second output nodes NDS20 and NDS21 deliver two sinusoidal signals SGS20 and SGS21 (the two components of the transposition signal SGS2) offset by 180° and also having the frequency double the initial frequency or 28 GHz.

Between the polyphase filter PPF and the mixer modules MX1-MX4 there is advantageously, although this is not indispensable, a voltage-amplification circuit AMP, the structure of which on the one hand and the connection of which between the polyphase filter PPF and the various mixer modules MX1-MX4 on the other hand will be revisited below in more detail.

Reference is now made more particularly to FIG. 3 to describe in more detail the structure of a mixer module MXi (i=1 to 4).

This structure is identical for the four mixer modules.

The mixer module MXi comprises a voltage/current transconductor stage ETT including first transistors, here the transistors NMOS, N5 and N6.

This current transconductor stage is connected to a mixing stage ETM via capacitors.

The mixing stage ETM includes second transistors, here also NMOS transistors, N1 to N4.

Before revisiting in more detail the structure of the mixing stage, the transconductor stage ETT will now be described in more detail.

The transconductor stage ETT comprises a first input interface including two first input terminals BE10$i$ and BE11$i$ respectively connected via two capacitors C1 and C2 to the gates of the two first transistors N5 and N6.

The sources of these two first transistors are directly connected to the ground GND.

The two first input terminals BE10$i$ and BE11$i$ are intended to respectively receive two first signals having a sinusoidal shape offset by 180°.

More precisely, as will be seen in more detail below, according to the index of the mixer module, these two first signals are either sinusoidal signals or cosinusoidal signals.

The transconductor stage also comprises a current-amplifier block BLA connected between the gate and the drain of each of the first transistors N5 and N6.

Here, this current amplifier block includes a transistor PMOS connected between a power supply terminal intended to receive the power supply voltage VDD and the drain of the corresponding first transistor (N5 or N6) as well as a resistor connected between the gate of the transistor PMOS and its drain.

The current-amplification block BLA also includes a capacitor connected between the gate of the transistor PMOS and the gate of the corresponding first transistor (N5 or N6).

The transconductor stage ETT also includes a polarization circuit including two resistors RB3 and RB4 respectively connected between the gates of the two first transistors N5 and N6 and a polarization input intended to receive a polarization voltage VBias.

This polarization voltage, adjustable, allows setting of the current circulating in the transistors N5 and N6.

Typically, a low current can be obtained, for example 1 milliampere, which allows limiting of the consumption of current of the mixer module.

The mixing stage ETM comprises a second input interface including two second input terminals BE20$i$ and BE21$i$ respectively connected to the gates of two pairs N1, N4 and N2, N3 of the second transistors N1-N4, via two other capacitors C6 and C5.

The mixing stage ETM also includes an output interface including two output terminals BS10$i$ and BS11$i$, each output terminal being connected to two second transistors belonging to two different pairs.

More precisely, in this example, the output terminal BS10$i$ is connected to the drains of the two transistors N1 and N3 while the output terminal BS11$i$ is connected to the drains of the two transistors N2 and N4.

The mixing stage ETM further includes a resistive degeneration circuit connected to the sources of the second transistors N1 to N4.

More precisely, in this differential architecture, the resistive degeneration circuit includes two resistors R1 and R2 connected in series between the sources of the transistors N1 and N2 and two resistors R3 and R4 connected in series between the sources of the transistors N3 and N4.

The midpoint of each pair of degeneration resistors is connected to the drain of the first corresponding transistor N5 or N6 via a capacitor.

The two second input terminals BE20$i$ and BE21$i$ are intended to respectively receive two second signals having a sinusoidal shape offset by 180° (either sinusoidal signals or cosinusoidal signals according to the index i of the mixer module MXi).

These two second signals are either identical to the two first signals received on the two first input terminals BE10i and BE11i or offset by 90° with respect to these two first signals, here again according to the index i of the mixer module MXi.

The mixing stage ETM also includes a calibration input ECi connected to the gates of the second transistors N1-N4 via two resistors RB1 and RB2.

This calibration input is intended to receive an adjustable calibration voltage that is used as will be seen in more detail below during a calibration phase.

Reference is now made more particularly to FIG. 4 to describe the mutual connections of the various mixing modules MX1-MX4.

The two first input terminals BE10i and BE11i of the mixer module MX1 as well as the two second input terminals BE20i and BE21i of this first mixer module MX1 are respectively connected to the two first generation terminals BG10 and BG11 respectively delivering the sinusoidal signals SG10 and SG11 (FIG. 2).

While the two first terminals BE101 and BE111 are directly connected to the generation terminals BG10 and BG11, the second input terminals BE201 and BE211 are connected thereto via two voltage-amplification circuits AMP101 and AMP111 that are part of the voltage-amplification circuit AMP illustrated in FIG. 2.

The two first input terminals BE102 and BE112 of the second mixer module are directly connected to the two second generation terminals BG20 and BG21 delivering the two cosinusoidal signals SG20 and SG21 (FIG. 2).

The two second input terminals BE202 and BE212 of the second mixer module MX2 are also connected to these two second generation terminals BG20 and BG21 but this time via two voltage-amplification circuits AMP102 and AMP112 that are also part of the voltage-amplification circuit AMP illustrated in FIG. 2.

In general, the two output terminals of a mixer module respectively deliver two differential signals offset by 180°, that is to say a "plus" signal and a "minus" signal.

The two output terminals BS101 and BS111 of the first mixer module are respectively connected to the two opposite output terminals BS102 and BS112 of the second mixer module MX2 in such a way as to form the difference in current at two first output nodes NDS10 and NDS11 intended to generate the two cosinusoidal signals offset by 180° SGS10 and SGS11 having the frequency double the initial frequency.

The two input terminals BE103 and BE113 of the third mixer module MX3 are respectively connected to the two first generation terminals BG10 and BG11 delivering the two sinusoidal signals SG10 and SG11.

The two second input terminals BE203 and BE213 of this third mixer module MX3 are respectively connected to the two second generation terminals BG20 and BG21 via two voltage-amplification circuits AMP103 and AMP113 that are part of the voltage-amplification circuit AMP of FIG. 2 and are thus intended to receive the two cosinusoidal signals SG20 and SG21 offset by 180°.

The two input terminals BE104 and BE114 of the fourth mixer module MX4 are respectively connected to the two first generation terminals BG20 and BG21 delivering the two cosinusoidal signals SG20 and SG21.

The two second input terminals BE2o4 and BE214 of this fourth mixer module MX4 are connected, via two voltage-amplification circuits AMP1o4 and AMP114 that are also part of the voltage-amplification circuit AMP of FIG. 2 to the two first generation terminals BG10 and BG11 respectively delivering the two sinusoidal signals offset by 180° SG10 and SG11.

The two output terminals BS103 and BS113 of the third mixer module MX3 are respectively connected to the two homologous output terminals BS104 and BS114 of the fourth mixer module MX4 in such a way as to form the sum of the currents at two second output nodes NDS20 and NDS21 generating the two sinusoidal signals SGS20 and SGS21 offset by 180° and having the frequency double the initial frequency.

This specific connection of the output terminals of the various mixer modules thus allows elimination of the use of adders and of subtractors to generate the output signals offset by 90° having the frequency double the initial frequency.

Reference is now made more particularly to FIG. 5 to illustrate an embodiment of a voltage-amplification circuit that is part of the voltage-amplification circuit AMP of FIG. 2.

More precisely, the circuit AMP101 is illustrated here. The structure of the other amplification circuits illustrated in FIG. 4 is identical to the structure of the amplifier AMP101.

More precisely, the circuit AMP101 includes an inverter IV, the power supply voltage of which is adjustable via a voltage regulator LDO, for example of the low-dropout type.

The input of this inverter IV is connected to the corresponding generation terminal (here the terminal BG10) via a capacitor C and the output of the inverter is connected to the corresponding input terminal (here the terminal BE201) of the corresponding mixer module.

An impedance Z is connected in parallel to the terminals of the inverter IV.

The regulator LDO allows limiting of the variations in the power supply voltage. The inverter IV associated with the regulator LDO amplifies the input signal in order to have a sinusoidal signal with a low harmonic distortion at the gates of the second transistors of the corresponding mixer stage.

The device also includes (FIG. 6) a calibration circuit MCAL connected to the control inputs EC1-EC4 of the four mixer modules MX1 to MX4, in such a way as to adjust the calibration voltage VGM according to the phase shift between the sinusoidal and cosinusoidal signals delivered to the output nodes NDS10 and NDS11 and NDS20 and NDS21.

In this respect, the resistive degeneration circuits R1 to R4 allow to reduce, or even to eliminate, the static phase error in the offset by 90° of the output signals SGS10, SGS11 and SGS20, SGS21 by the addition of a phase shift at the frequency double the initial frequency between the signals SGS10, SGS11 on the one hand and SGS20, SGS21 on the other hand.

The values of these resistances are determined by simulation on a nominal device. However, the process variations can be compensated for by adjusting the calibration voltage VGM, which allows obtaining of a precision of approximately plus or minus 1 degree in the offset by 90° even in the presence of these process variations.

The measurement of the phase shift between the output signals SGS10, SGS11 and SGS20 and SGS21 can be carried out by any means, for example during the phase of production via a test bench equipped with an oscilloscope or on the embedded device for example via a demodulated test signal.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An electronic device comprising:
a first mixer module comprising:
a voltage/current transconductor stage comprising:
first transistors;
a polarization circuit including two first resistors respectively connected between gates of the first transistors and a polarization input configured to receive an adjustable polarization bias voltage for setting of a current circulating in the first transistors;
a first current amplifier block having a first capacitor connected between a gate of a first one of the first transistors and a gate of a third transistor, and a second resistor coupled between the gate of the third transistor and a drain of the third transistor; and
a second current amplifier block having a second capacitor connected between a gate of a second one of the first transistors and a gate of a fourth transistor, and a third resistor coupled between the gate of the fourth transistor and a drain of the fourth transistor; and
a mixing stage connected to the voltage/current transconductor stage, the mixing stage comprising:
second transistors;
a resistive degeneration circuit connected to sources of the second transistors; and
a calibration input connected to gates of the second transistors and configured to receive an adjustable calibration voltage, wherein sources of the first transistors are directly connected to a cold power supply point; and
a calibration circuit configured to adjust the adjustable calibration voltage in accordance with at least a phase of outputs of the second transistors.

2. The electronic device according to claim 1, wherein:
the third transistor of the first current amplifier block has a source connected to a power supply terminal and a drain connected to a drain of the first one of the first transistors; and
the fourth transistor of the second current amplifier block has a source connected to the power supply terminal and a drain connected to a drain of the second one of the first transistors.

3. The electronic device according to claim 1,
wherein the transconductor stage further comprises a first input interface including two first input terminals respectively connected to gates of two first transistors; and
wherein the mixing stage further comprises:
a second input interface including two second input terminals respectively connected to the gates of two pairs of the second transistors; and
an output interface including two output terminals, each output terminal being connected to two of the second transistors belonging to two different pairs.

4. The electronic device according to claim 3, wherein the two first input terminals are configured to respectively receive two first signals having sinusoidal shapes offset by 180°, wherein the two second input terminals are configured to respectively receive two second signals having sinusoidal shapes offset by 180°, and wherein the two second signals are either identical to the two first signals or offset by 90° with respect to the two first signals.

5. The electronic device according to claim 4, further comprising:
a signal generator having two first generation terminals configured to generate two first sinusoidal signals offset by 180° and two second generation terminals configured to generate two first cosinusoidal signals offset by 180°, the first sinusoidal and first cosinusoidal signals having a same initial frequency;
the first mixer module, including two first mixer input terminals and two second mixer input terminals respectively connected to the two first generation terminals;
a second mixer module, including two third mixer input terminals and two fourth mixer input terminals respectively connected to the two second generation terminals;
wherein two output terminals of the first mixer module are respectively connected to two opposite output terminals of the second mixer module, thereby forming two first output nodes configured to generate two second cosinusoidal signals offset by 180° having a frequency double the initial frequency;
a third mixer module, including two fifth mixer input terminals respectively connected to the two first generation terminals, and two sixth mixer input terminals respectively connected to the two second generation terminals; and
a fourth mixer module, including two seventh mixer input terminals respectively connected to the two second generation terminals, and two eight mixer input terminals respectively connected to the two first generation terminals;
wherein two output terminals of the third mixer module are respectively connected to two homologous output terminals of the fourth mixer module, thereby forming two second output nodes configured to generate two second sinusoidal signals offset by 180° having a frequency double the initial frequency.

6. The electronic device according to claim 5,
wherein the signal generator comprises:
a signal source configured to generate an initial signal having a sinusoidal shape having the initial frequency; and
a polyphase filter connected between an output of the signal source and the first and second generation terminals; and
wherein the electronic device further comprises a voltage-amplification circuit connected between each second terminal of each mixer module and a corresponding one of the generation terminals.

7. The electronic device according to claim 5, wherein the calibration circuit is configured to adjust the adjustable calibration voltage according to a phase shift between the second sinusoidal and second cosinusoidal signals generated at the first and second output nodes.

8. The electronic device according to claim 5, wherein the initial frequency is greater than or equal to 10 GHz.

9. The electronic device according to claim 8, wherein the initial frequency is equal to 14 GHz.

10. A communication apparatus comprising:
a signal generator having two first generation terminals configured to generate two first sinusoidal signals offset by 180° and two second generation terminals configured to generate two first cosinusoidal signals offset by 180°, the first sinusoidal and first cosinusoidal signals having a same initial frequency;

a first mixer module, including two first input terminals and two second input terminals respectively connected to the two first generation terminals;

a second mixer module, including two third input terminals and two fourth input terminals respectively connected to the two second generation terminals;

wherein two output terminals of the first mixer module are respectively connected to two opposite output terminals of the second mixer module, thereby forming two first output nodes configured to generate two second cosinusoidal signals offset by 180° having a frequency double the initial frequency;

a third mixer module, including two fifth input terminals respectively connected to the two first generation terminals, and two sixth input terminals respectively connected to the two second generation terminals;

a fourth mixer module, including two seventh input terminals respectively connected to the two second generation terminals, and two eighth input terminals respectively connected to the two first generation terminals;

wherein two output terminals of the third mixer module are respectively connected to two homologous output terminals of the fourth mixer module, thereby forming two second output nodes configured to generate two second sinusoidal signals offset by 180° having a frequency double the initial frequency;

wherein each mixer module comprises:
  a mixing stage comprising:
    second transistors;
    a resistive degeneration circuit connected to sources of the second transistors; and
    a calibration input connected to gates of the second transistors and configured to receive an adjustable calibration voltage; and
  a voltage/current transconductor stage connected to the mixing stage, the voltage/current transconductor stage comprising:
    a polarization circuit including two first resistors respectively connected between gates of first transistors and a polarization input configured to receive an adjustable polarization bias voltage for setting of a current circulating in the first transistors;
    a first current amplifier block having a first capacitor connected between a gate of a first one of the first transistors and a gate of a third transistor, and a second resistor coupled between the gate of the third transistor and a drain of the third transistor; and
    a second current amplifier block having a second capacitor connected between a gate of a second one of the first transistors and a gate of a fourth transistor, and a third resistor coupled between the gate of the fourth transistor and a drain of the fourth transistor;

a reception chain;
an emission chain;
  wherein the reception chain and the emission chain are configured to receive, from the first and second output nodes, the second sinusoidal and second cosinusoidal signals forming two components offset by 90° of a frequency transposition signal; and a calibration circuit configured to adjust the adjustable calibration voltage for the mixer modules according to a phase shift between the second sinusoidal and second cosinusoidal signals generated at the first and second output nodes.

11. The communication apparatus according to claim 10, configured to operate in a fifth generation (5G) frequency band.

12. The communication apparatus according to claim 10, wherein the frequency transposition signal is 28 GHz.

13. The communication apparatus according to claim 10, wherein the signal generator comprises:
  a signal source configured to generate an initial signal having a sinusoidal shape having the initial frequency; and
  a polyphase filter connected between an output of the signal source and the first and second generation terminals; and
wherein the communication apparatus further comprises a voltage-amplification circuit connected between each second terminal of each mixer module and a corresponding one of the generation terminals.

14. The communication apparatus according to claim 10, wherein the initial frequency is greater than or equal to 10 GHz.

15. The communication apparatus according to claim 14, wherein the initial frequency is equal to 14 GHz.

16. The communication apparatus according to claim 10, wherein sources of the first transistors are directly connected to a cold power supply point.

17. The communication apparatus according to claim 16, wherein:
  the third transistor of the first current amplifier block has a source connected to a power supply terminal and a drain connected to a drain of the first one of the first transistors; and
  the fourth transistor of the second current amplifier block has a source connected to the power supply terminal and a drain connected to a drain of the second one of the first transistors.

18. The communication apparatus according to claim 16, wherein the transconductor stage further comprises a first input interface including two ninth input terminals respectively connected to gates of two first transistors; and
wherein the mixing stage further comprises:
  a second input interface including two tenth input terminals respectively connected to gates of two pairs of second transistors; and
  an output interface including two interface output terminals, each interface output terminal being connected to two second transistors belonging to two different pairs.

19. The communication apparatus according to claim 18, wherein the two ninth input terminals are configured to respectively receive two first signals having sinusoidal shapes offset by 180°, wherein the two tenth input terminals are configured to respectively receive two second signals having sinusoidal shapes offset by 180°, and wherein the two second signals are either identical to the two first signals or offset by 90° with respect to the two first signals.

* * * * *